United States Patent [19]

Nishimura et al.

[11] Patent Number: 5,027,044
[45] Date of Patent: Jun. 25, 1991

[54] LOAD STATE DECISION APPARATUS FOR SERVOMOTOR

[75] Inventors: Makoto Nishimura; Shigeaki Takase, both of Aichi, Japan

[73] Assignee: Mitsubishi Denki Kabushiki Kaisha, Tokyo, Japan

[21] Appl. No.: 504,209

[22] Filed: Apr. 4, 1990

[30] Foreign Application Priority Data

Apr. 11, 1989 [JP] Japan .................. 1-42111[U]

[51] Int. Cl.$^5$ ............................................. G06F 15/46
[52] U.S. Cl. ............................ 318/568.11; 318/603; 318/594; 318/632; 364/474.11; 364/513
[58] Field of Search ................... 318/560–640, 318/430–434; 388/808–829; 364/513, 474.11, 474.13

[56] References Cited

U.S. PATENT DOCUMENTS

| 4,475,160 | 10/1984 | Inaba | 318/568.11 X |
| 4,574,227 | 3/1986 | Herder et al. | 318/594 |
| 4,607,196 | 8/1986 | Abrahams et al. | 318/603 X |
| 4,638,221 | 1/1987 | Brignall | 318/632 X |

FOREIGN PATENT DOCUMENTS 5665208 11/1979 Japan .
61139854 12/1984 Japan .
62136343 12/1985 Japan .
61-68472 3/1986 Japan .

Primary Examiner—Paul Ip
Attorney, Agent, or Firm—Rothwell, Figg, Ernst Kurz

[57] ABSTRACT

A load state decision apparatus of a servomotor where a load current value of a servomotor during operation is sampled and compared with a prescribed value and then the load state is decided based on the result, a motor current value is detected by adding the function to the existing apparatus and the detected motor current value is sampled at prescribed time intervals and stored in a memory, and an effective current value is calculated from the current value data and the calculated effective current value is compared with the rated current value and the load state of the servomotor is decided, thereby a converting or detecting apparatus need not be installed externally but the load state can be decided automatically.

10 Claims, 4 Drawing Sheets

LOAD STATE DECISION APPARATUS FOR SERVOMOTOR

BACKGROUND OF THE INVENTION

1. Field of the Invention

The present invention relates to a load state decision apparatus for a servomotor wherein a load current value of a servomotor during operation is sampled and compared with a prescribed value and then the load state of the servomotor is decided based on the result of the comparison.

2. Description of the Prior Art

In the prior art, variable data regarding a servomotor according to the load state of the servomotor during the operation, i.e., the load applied to the servomotor, torque, power, delay, speed or the like is obtained by using a detecting apparatus. As a well-known apparatus, a waveform recording instrument such as an oscilloscope is used, and the waveform is recorded and compared with a standard waveform and the data is determined. There is also known another means where consumption power of the servomotor is measured by using a watthour meter or the like and divided by the measuring time to thereby calculate the effective current which is compared with the rated current. In any case, in order to obtain necessary data, a special converting or detecting apparatus is installed externally and the necessary data is produced based on the data obtained from the converting or detecting apparatus.

In the prior art, when the load state of the servomotor is decided, for example, if an oscilloscope must be used, technical knowledge such as use manner of using the oscilloscope, utilizing a connection terminal, etc. is necessary and thus personal error may be introduced into the decision. Also, for example, use of a watthour meter is troublesome and not practical. Further, the converting or detecting apparatus installed externally increases the cost of the motor or may cause a fault in the system.

SUMMARY OF THE INVENTION

In order to solve the above-mentioned problems in the prior art, a main object of the invention is to provide a load state decision apparatus for a servomotor wherein a converting or detecting a such as an oscilloscope is not required, but a load state decision result can be obtained automatically and objectively.

Another object of the invention is to provide a load state decision apparatus for a servomotor wherein a complicated and expensive converting or detecting apparatus is not used, but a load state decision result can be obtained by a simple and cheap means.

Still another object of the invention is to provide a load state decision apparatus of a servomotor wherein the apparatus is simple in structure and can be realized in small size.

In order to attain the foregoing objects, a load state decision apparatus for a servomotor according to the invention comprises means for detecting a motor current value, means for sampling the detected motor current value at prescribed time intervals and transferring the sampled value as current value data from a servo control unit to a memory of a positioning apparatus and storing the data, means for calculating an effective current value from the stored current value data, and means for comparing the calculated effective current value with the rated current value and performing a decision operation.

That is, in a load state decision apparatus for a servomotor according to the invention, a motor current value is sampled, and an effective current value is calculated from the sampled data, and the calculated effective current value is compared with the rated current value thereby the load state of the motor is decided.

The above and further objects and novel features of the invention will more fully appear from the following detailed description when the same is read in connection with the accompanying drawings. It is to be expressly understood, however, that the drawings are for purposes of illustration only and are not intended as a definition of the limits of the invention.

DETAILED DESCRIPTION OF THE PREFERRED EMBODIMENTS

A preferred embodiment of the invention will now be described in detail referring to the accompanying drawings.

Figure 1:
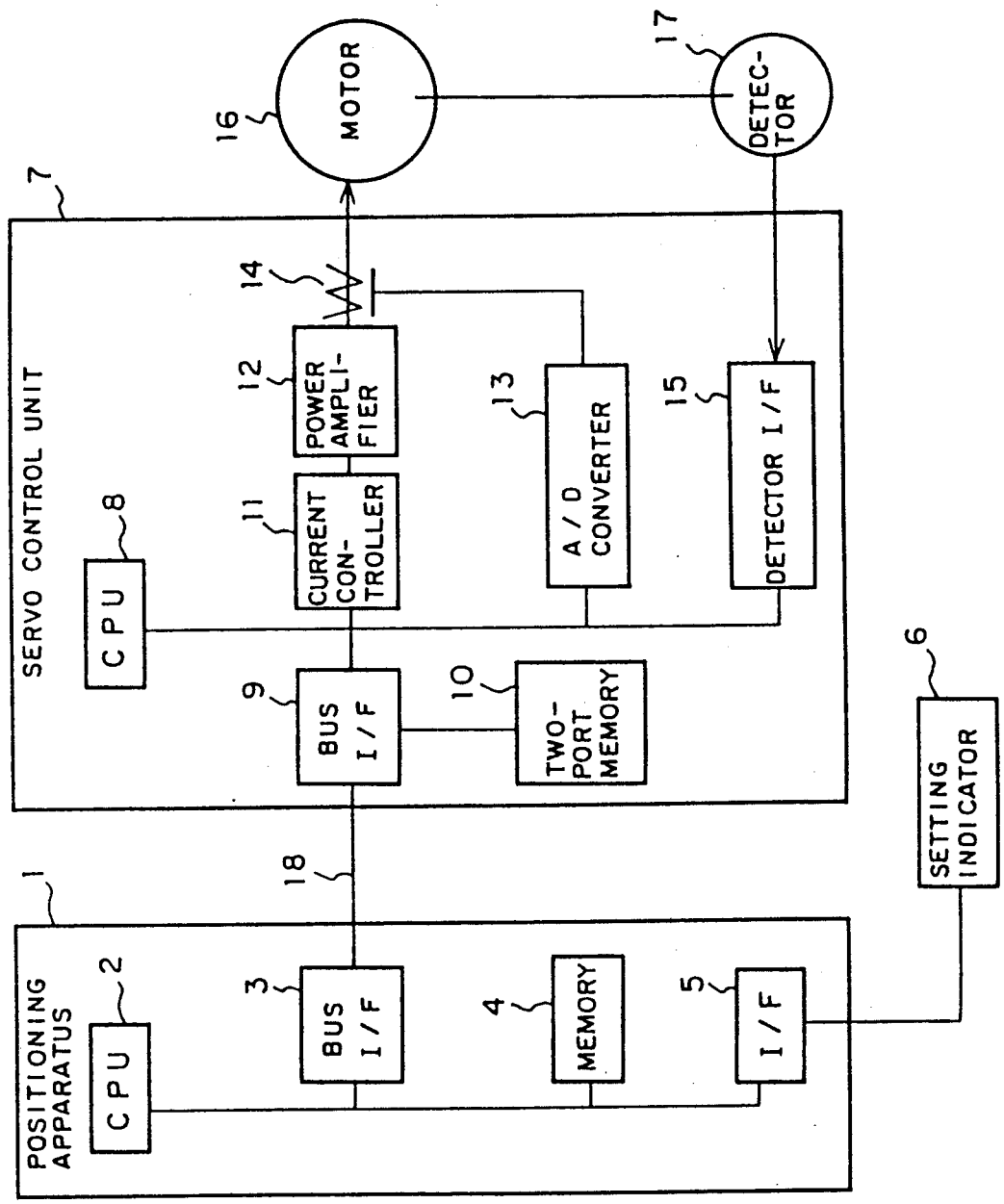
FIG. 1 is a constitution view of a servomotor positioning control system as an embodiment of the invention.

FIG. 1 shows a servomotor positioning control system as an embodiment of the invention. In FIG. 1, reference numeral 1 designates a positioning apparatus, numeral 2 designates a CPU of the positioning apparatus 1, numeral 3 designates a bus I/F for interfacing with a servo control unit 7, numeral 4 designates a memory for storing data read from two-port memory 10 of a servo control unit 7, numeral 5 designates an interface section (I/F section) to a setting 6 indicator having a display device and an operation key, numeral 8 designates a CPU of the servo control unit 7, numeral 9 designates a bus I/F for interfacing with the positioning apparatus 1, numeral 10 designates a two-port memory capable of accessing the CPU 2 of the positioning apparatus 1 and the CPU 8 of the servo control unit 7, numeral 11 designates a current controller for controlling current supplied to a servo motor 16, numeral 12 designates a power amplifier for producing current supplied to servo motor 16 according to a command of the current controller 11, numeral 13 designates an A/D converter where an analog value of current detected by a motor current detector 14 is converted into a digital value, motor current detector 14 detects the motor current transmitted from the power amplifier 12, numeral 15 designates a detector I/F for inputting a pulse signal outputted from a detector 17 and for calculating a position feedback value and a speed feedback value and transmitting the feedback values to the CPU 8, detector 17 obtains position information and speed information of the servomotor 16, and numeral 18 designates a bus cable connecting the positioning apparatus 1 and the servo control unit 7.

Next, operation will be described. As a general operation, a command is outputted from the positioning apparatus 1 according to a command of the setting indicator 6, and power is supplied from the servo control unit 7 to the motor 16 according to the command of the positioning apparatus 1, thereby the motor 16 is rotated. The detector 17 feeds back the position or speed of the motor 16 to the servo control unit 7. Current supplied to the motor 16 is detected by the motor current detector 14 and is converted into digital quantity by the A/D converter 13 and is fed back to CPU 8.

Next, operation of deciding the load state will be described. First, means for sampling the current value detected by the motor current detector 14 and for transferring the sampled value from the servo control unit 7 to the positioning apparatus 1 will be described.

Figure 2:
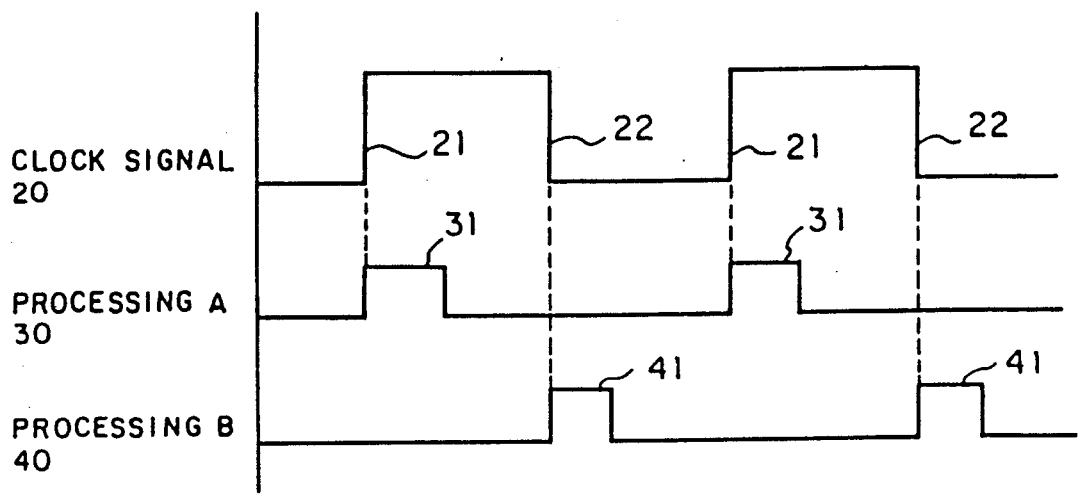
FIG. 2 is a timing chart illustrating a data sampling processing timing according to an embodiment of the invention.

FIG. 2 shows the data sampling processing according to an embodiment of the invention. In FIG. 2, a clock signal 20 is generated by a clock (not shown) incorporated in the positioning apparatus 1, and is outputted also to the servo control unit 7 through the bus cable 18. One period of the clock signal 20 is 3–5 ms, and one data frame is transferred during this period.

Processing A is that processing at the side of the servo control unit 7, and when the CPU 8 of the servo control unit 7 detects rising edge 21 of the clock signal 20, the execution begins, and the period of the clock signal 20 is set so that the execution of the CPU 8 is always finished before the falling edge 22 of the clock signal 20. Numeral 31 represents the time that the processing A is being executed.

Figure 3:
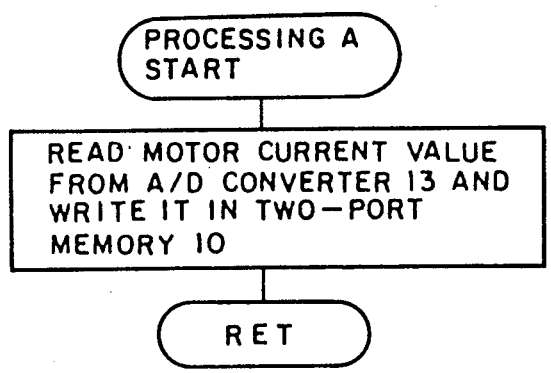
FIG. 3 is a flow chart illustrating processing A according to an embodiment of the invention.

Content of the processing A is shown in FIG. 3. In this process, a motor current value detected by the motor current detector 14 and converted into a digital value by the A/D converter 13 is inputted and it is written into a determined area of the two-port memory 10. Thereafter the current value data is sampled in the two-port memory 10 during one period of the clock signal 20.

Next, processing B is that processing at the side of the positioning apparatus 1, and the execution is started when the CPU 2 of the positioning apparatus 1 detects the falling edge 22 of the clock signal 20 and it is always finished before the rising edge 21 of next clock signal 20. That is, the period of the clock signal 20 is set so that each of the required times for the processing A and the required time for the processing B is within a half period of the clock signal 20. Numeral 41 represents the time that processing B is executed. In actual fact, the processing required to access the two-port memory 10 may be finished before the rise time of next clock signal 20, and the processing not acessing the two-port memory 10 is possible irrespective of the clock signal 20.

Figure 4:
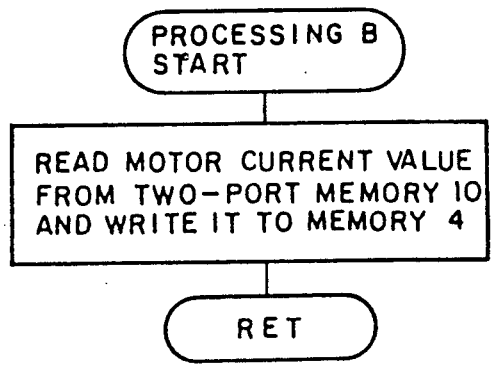
FIG. 4 is a flow chart illustrating processing B according to an embodiment of the invention.
Figure 6:
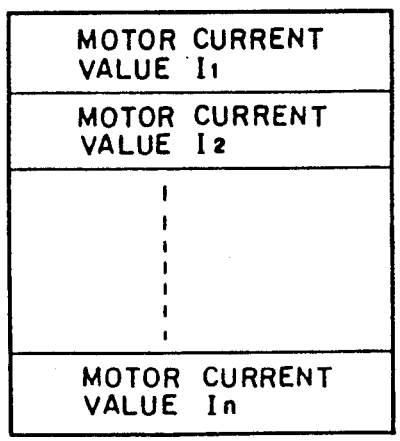
FIG. 6 is a constitution view illustrating a record constitution within a memory according to an embodiment of the invention.

Content of the processing B is shown in FIG. 4. In this purpose the motor current value data is read from a determined area of the two-port memory 10 and is written into a determined area of the memory 4 of the positioning apparatus 1. The positioning apparatus 1 reads the motor current value at the time intervals determined by the clock signal 20. FIG. 6 shows one form of the motor current value data stored in the memory 4.

Figure 5:
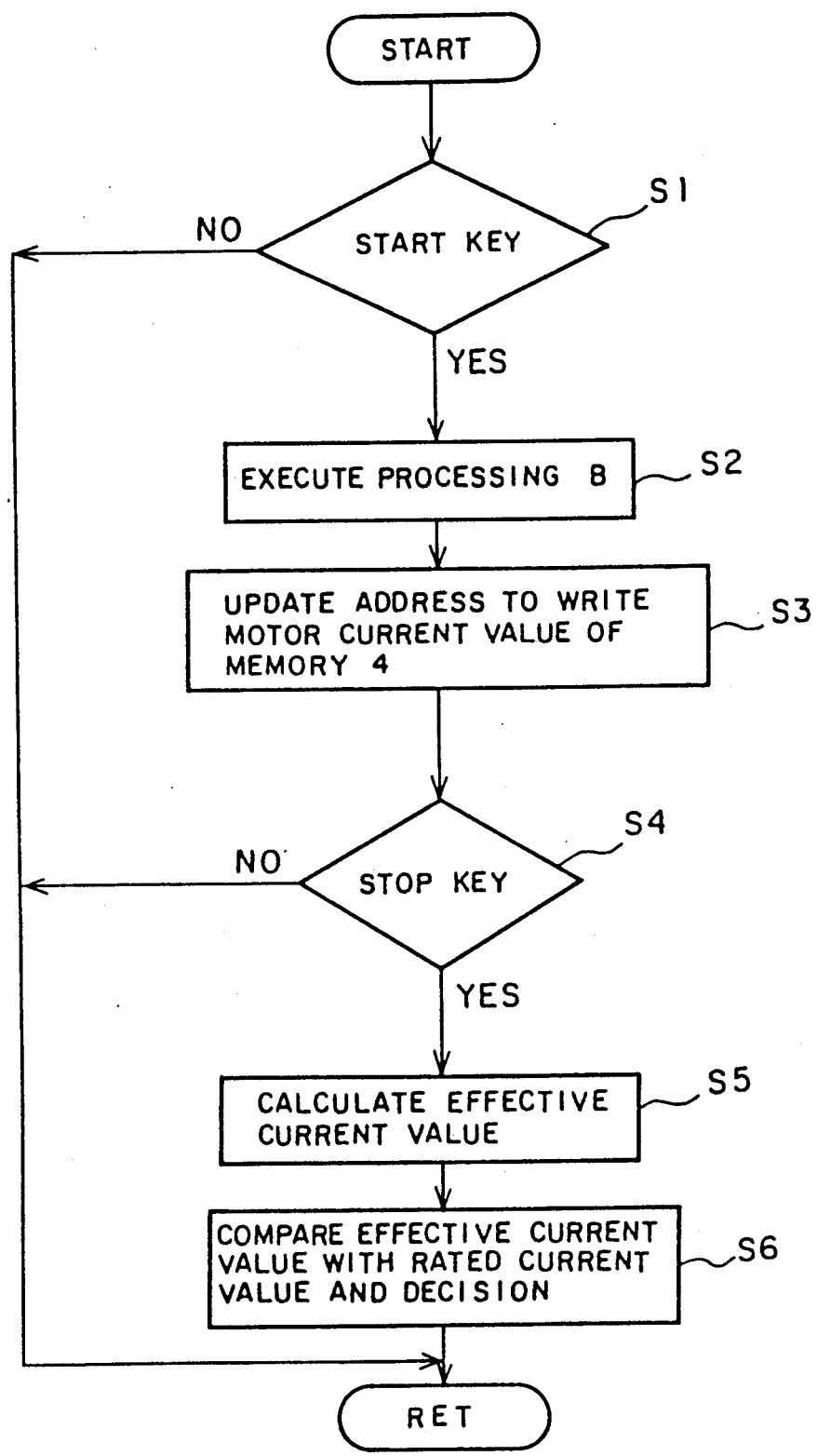
FIG. 5 is a flow chart illustrating processing as a whole according to an embodiment of the invention.

FIG. 5 shows the whole processing of the load state decision according to an embodiment of the invention. The load state decision processing shown in FIG. 5 will be described. In order to decide the load state of the motor during a positioning operation, the start key of the setting indicator 6 is pushed. Then, process becomes "YES" at step S1, and is transferred to the processing B of step S2. At the processing B, as shown in FIG. 4, the motor current value data is read from the two-port memory 10 and written into the memory 4. Next, process is transferred to step S3, and the address to write the next motor current value into is updated. When this updating is finished, process returns to the beginning, and as long as a stop key is not pushed, the above-mentioned steps are repeated, and as shown in FIG. 6, the motor current value data is recorded in the memory 4.

After lapse of the desired time for reading data, a stop key of the setting indicator 6 is pushed. Then, process is transferred from step S4 to step S5, the current value data stored in the memory 4 is read, and then the effective current value is calculated by hereinafter described means. Next, process is transferred to step S6, and the calculated effective current value is compared with the rated current value and the load state is decided and indicated on the setting indicator 6, or the decision result of the load state is utilized, for example, as feedback data in the control of the motor.

Next, calculation method of the effective current value Ie will be described.

Effective current is estimated by taking the mean square value of the current data. That is, each data is squared and the sum is calculated and divided by the number of data samples and its squares root is estimated, thereby the effective value can be obtained.

Figure 8:
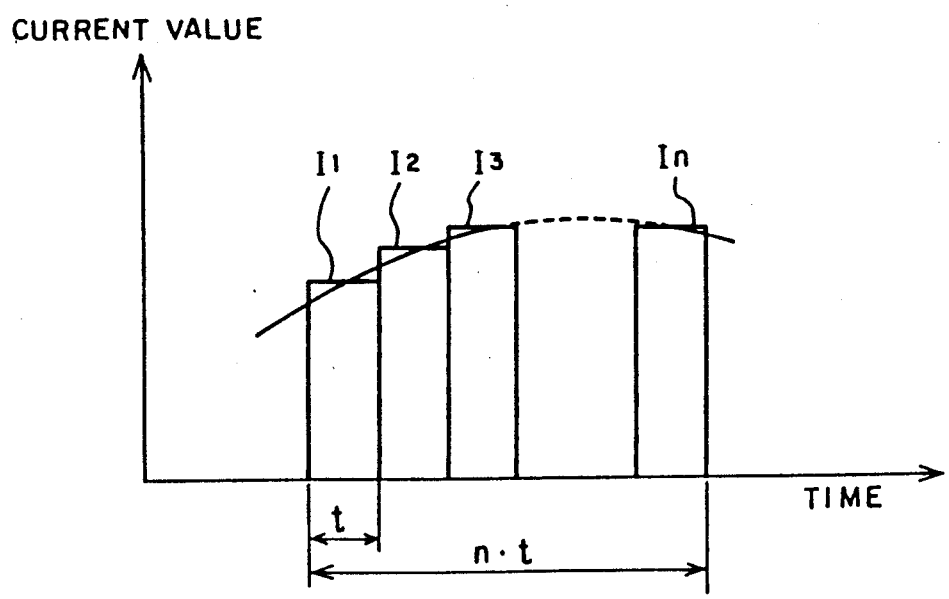
FIG. 8 is an explanation diagram illustrating calculation of an effective value according to an embodiment of the invention.

That is, the root of $$[(I_1^2 + I_2^2 + \ldots + I_n^2)/n[$$

may be calculated. n designates the number of data samples. FIG. 8 shows the calculation of the effective current value Ie. Eventually, the effective current value Ie is expressed as follows.

$$Ie = \sqrt{(I_1^2 + I_2^2 + \ldots + I_n^2)/n}$$

The effective current value calculated in this manner is compared with the rated current and the decision is performed. However, since the rated current value is different depending on the capacity and condition of the motor, if the rated current value is made 100% and the effective current value is expressed by %, it can be more readily understood.

Figure 7:
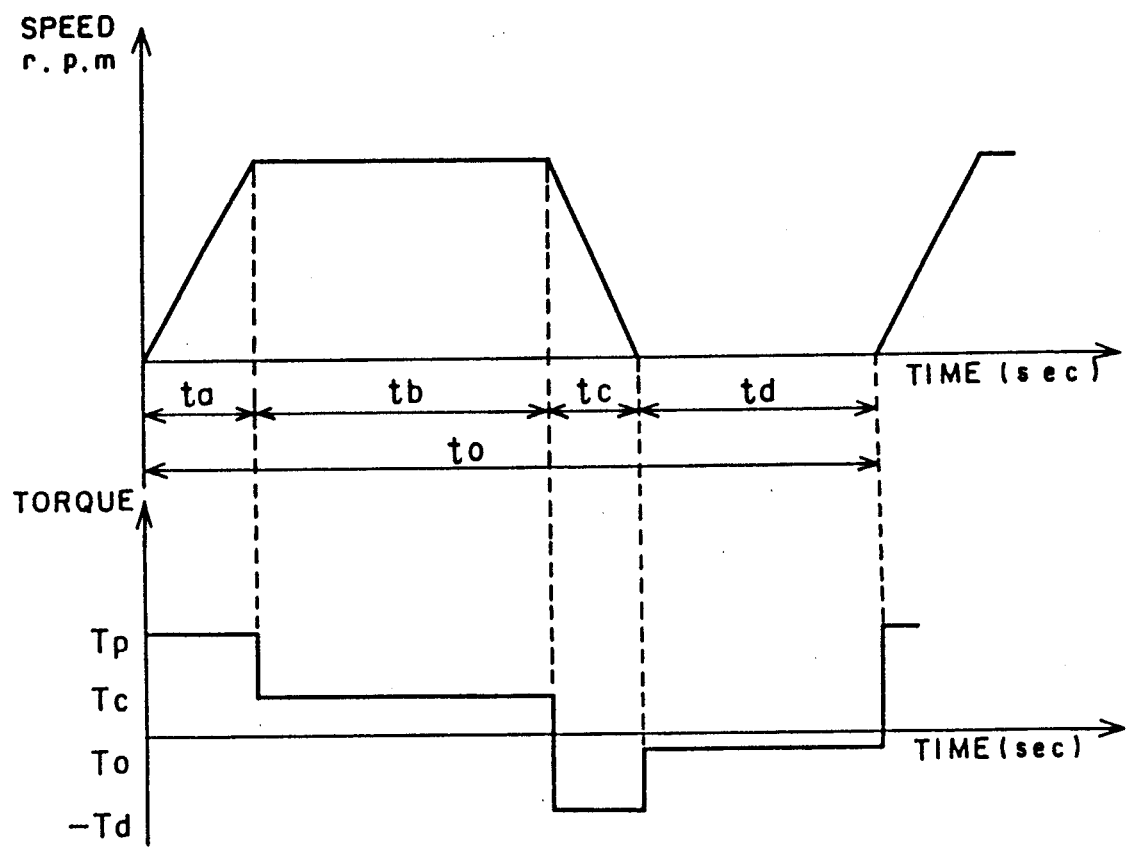
FIG. 7 is a characteristic diagram illustrating an example of torque or current values of a servomotor.

Time of sampling the current value or the number of samples can be set arbitrarily in that a harmonic generating converter or the like is interposed with the clock signal thereby the signal period is made variable, and the effective value being the calculated mean square value is compared with the rated current determined corresponding to the sampled time thereby the load state can be decided. Consequently, the instantaneous maximum current value is sampled and the effective value is calculated and compared with the rated value corresponding to this, thereby the load state can be decided. As shown in FIG. 7, the current values of the motor are indicative of the torque and thus of the speed of the motor.

Since the torque and the calorific value of the motor is proportional to current, the decision of the load state becomes decision of the thermal margin of the motor.

According to the invention as above described, using the positioning apparatus and the servo control unit, the motor current value is sampled and the effective value is calculated and compared with the rated current and the load state is decided, thereby the decision of the load state can be performed automatically.

Further according to the invention, a converting or detecting apparatus such as an oscilloscope need not be installed and the load state is decided by the positioning apparatus and the servo control unit, thereby the load state can be decided easily at low cost.

Still further according to the invention, since a converting or detecting apparatus such as an oscilloscope need not be installed and the positioning apparatus and the servo control unit already existing are provided with the load state deciding function, an apparatus need not be newly added and the load state can be decided using a conventional apparatus structure as it is.

What is claimed is:

1. A load state decision apparatus for a servomotor having a rated current value, comprising:
    means for detecting a load current value of a load current supplied to said servomotor;
    means for sampling the detected load current value at predetermined time intervals;
    means for storing the sampled load current value as current value data;
    means for calculating an effective current value from said current value data; and
    means for comparing said effective current value with said rated current value and deciding the load state of the servomotor from the result of the comparison.

2. A load state decision apparatus for a servomotor according to claim 1, wherein said load current value detecting means is installed in a servo control unit for controlling said servomotor, and comprises:
    a load current detector for outputting an analog value corresponding to said load current; and
    A/D converter means for converting said analog value into a digital value that is read by said means for sampling at said predetermined time intervals.

3. A load state decision apparatus for a servomotor according to claim 2, wherein said predetermined time intervals are inputted to said sampling means in the form of a clock signal from a positioning apparatus for said servomotor.

4. A load state decision apparatus for a servomotor according to claim 2, wherein said sampling means comprises a CPU installed in said servo control unit, which CPU samples said load current value upon detection of a rising edge of said clock signal.

5. A load state decision apparatus for a servomotor as set forth in claim 4 wherein said means for storing comprises a two-port memory.

6. A load state decision apparatus for a servomotor according to claim 5, wherein said means for calculating comprises a CPU installed in said positioning apparatus, which CPU reads said current value data from said two-port memory upon detection of a falling edge of said clock signal.

7. A load state decision apparatus for a servomotor as set forth in claim 1, wherein when each current value data is made $I_1, I_2, \ldots, I_n$, said calculating means calculates the effective current value Ie by following formula $$Ie = \sqrt{(I_1^2 + I_2^2 + \ldots + I_n^2)/n}$$

wherein n: the number of data.

8. A load state decision apparatus for a servomotor as set forth in claim 1 wherein said comparing means indicates the effective current value in % when the rated current value corresponding thereto is expressed as 100%.

9. A load state decision apparatus for a servomotor as set forth in claim 3, wherein the period of the clock signal is set between 3 ms and 5 ms.

10. A load state decision apparatus for a servomotor as set forth in claim 3, wherein the clock signal is outputted through a harmonic generating converter, and the signal period can be varied arbitrarily.

* * * * *

UNITED STATES PATENT AND TRADEMARK OFFICE
CERTIFICATE OF CORRECTION

PATENT NO. : 5,027,044

DATED : June 25, 1991

INVENTOR(S) : Makoto Nishimura et al.

It is certified that error appears in the above-identified patent and that said Letters Patent is hereby corrected as shown below:

```
Column 1, line 29, after "externally" insert a comma --,--;
          line 34, delete "use" and substitute --the--;
          line 47, delete "a" and substitute --apparatus--.

Column 2, line 52, delete "6 indicator" and substitute --indicator 6--.

Column 3, line 17, after "into" insert --a--;
          line 62, delete "purpose" and substitute --process,--.
```

Signed and Sealed this

Fifth Day of January, 1993

Attest:

DOUGLAS B. COMER

Attesting Officer

Acting Commissioner of Patents and Trademarks